(12) United States Patent
Kutaragi et al.

(10) Patent No.: US 6,580,605 B1
(45) Date of Patent: Jun. 17, 2003

(54) ELECTRONIC EQUIPMENT AND HOUSING FOR ACCOMMODATING THE SAME

(75) Inventors: Ken Kutaragi, Tokyo (JP); Teiyu Goto, Tokyo (JP)

(73) Assignee: Sony Computer Entertainment, Inc., Tokyo (JP)

( * ) Notice: Subject to any disclaimer, the term of this patent is extended or adjusted under 35 U.S.C. 154(b) by 143 days.

(21) Appl. No.: 09/655,213

(22) Filed: Sep. 5, 2000

(30) Foreign Application Priority Data

Sep. 6, 1999 (JP) .......................................... 11-251817
Aug. 11, 2000 (JP) ...................................... 2000-244269

(51) Int. Cl.[7] ................................................ G06F 1/16
(52) U.S. Cl. ...................... 361/685; 361/679; 361/683; 312/223.2
(58) Field of Search ................................ 361/685, 683, 361/686, 684, 679, 696; 312/223.1, 223.2, 117; D14/100, 102, 105, 109, 124, 135, 217, 314, 348, 356, 357, 363; D21/412–416

(56) References Cited

U.S. PATENT DOCUMENTS

| | | | | |
|---|---|---|---|---|
| 4,728,160 A | * | 3/1988 | Mondor et al. | 312/236 |
| 5,668,697 A | * | 9/1997 | Dowdy | 361/685 |
| D398,910 S | * | 9/1998 | Suzuki | D14/107 |
| 5,995,363 A | * | 11/1999 | Wu | 361/679 |
| 6,088,221 A | * | 7/2000 | Bolognia | 361/685 |
| 6,147,859 A | * | 11/2000 | Abboud | 361/683 |
| D450,318 S | * | 11/2001 | Goto | D14/356 |
| 6,353,536 B1 | * | 3/2002 | Nakamura et al. | 361/686 |

FOREIGN PATENT DOCUMENTS

| | | |
|---|---|---|
| EP | 0867807 A1 | 9/1998 |
| JP | 56-2671 | 1/1981 |
| JP | 63-53747 | 3/1988 |
| JP | 10-284853 | 10/1998 |
| TW | 78209915 | 3/1990 |

* cited by examiner

*Primary Examiner*—Darren Schuberg
*Assistant Examiner*—Lisa Lea-Edmonds
(74) *Attorney, Agent, or Firm*—Katten Muchin Zavis Rosenman

(57) ABSTRACT

Electronic equipment comprising equipment elements and a housing for accommodating these equipment elements is provided. Electronic equipment comprises at least one equipment element for executing one of input and output of information between the electronic equipment and the external apparatus. The configuration of the housing has a form surrounded by a plurality of surfaces, and on at least one of said surfaces, there is provided a pattern of projections and depressions comprising a plurality of projecting ridges extending in the same direction. The plurality of projecting ridges is aligned in the same direction, and the one of the surfaces is provided with openings corresponding to at least one of the equipment elements. Two sides of each opening are aligned in the same direction as the projecting ridges.

23 Claims, 14 Drawing Sheets

ELECTRONIC EQUIPMENT AND HOUSING FOR ACCOMMODATING THE SAME

This application claims a priority based on Japanese Patent Application No. 11-251817 filed on Sep. 6, 1999, and No. 2000-244269 filed on Aug. 11, 2000, the entire contents of which are incorporated herein by reference for all purposes.

BACKGROUND OF THE INVENTION

The present invention relates to electronic equipment of which the equipment body is accommodated in a housing, and the housing for accommodating the same.

Electronic equipment such as an information processor generally comprises an equipment body and a housing for storing the same, and is used for various purposes with a recording medium, a memory card, a plug and the like mounted from outside. In case of an entertainment system for playing games, for example, a plug connector mounted on an end of a wire extending from a controller is connected to a socket connector, and a required memory card is mounted to a specialized socket connector. Then a recording medium such as CD, or DVD is mounted to a recording medium drive unit for reproduction thereof in order to execute the game stored in the recording medium.

SUMMARY OF THE INVENTION

In this type of the electronic equipment, the configuration and the appearance of the housing is designed so that it reliably accommodates the equipment body to be accommodated therein and can be connected with external equipment. Therefore, the configuration and the structure of the housing for the electronic equipment of this type is designed giving priority to these functions. Thereafter the appearance is designed based on the configuration and structure which satisfies the above functions.

Among various types of electronic equipment, sales of the product of which the final user is an individual are dependent not only on the performance thereof, but also on the visual design thereof. For example, the entertainment system used for the game, music reproduction, video reproduction, and communications is affected especially by the visual design. In such entertainment systems, there is a tendency that higher performance that enables reproduction of more real and more aesthetically pleasing moving pictures and execution of advanced games is desired. On the other hand, there is a tendency that the user evaluates the performance of the system influenced by the novelty of the visual design of the housing as well as description in catalogues or the advertisements for it. Therefore, in electronic equipment of this type, the visual design is a very important factor in development of the product.

On the other hand, it is also important that the electronic equipment can be used satisfying its original purpose for which it was designed, and that it provides excellent usability for the user. It should be avoided that the performance and the usability is deteriorated as a result of giving a priority to the design.

Accordingly, the housing is required to have a form in which the visual design and the performance of the electronic equipment in question are well merged. However, such consideration has not been given in the conventional housing of the electronic equipment.

It is an object of the present invention to provide electronic equipment that ensures good functionality and usability, as well as a form in which the performance of the electronic equipment and the visual design are well merged to realize an innovative design, and a housing for accommodating the same.

In order to achieve the object described above, the first embodiment of the present invention provides a housing for accommodating equipment elements for processing information, comprising a member constituting a plurality of surfaces surrounding a space for accommodating said equipment elements, wherein at least one of the plurality of surfaces is provided with a pattern of projections and depressions comprising an arrangement of a plurality of projecting ridges extending respectively in the same direction and a plurality of depressed grooves generated between the respective adjacent projecting ridges, and at least one opening that opens in the middle of the pattern of projections and depressions, two edges of which extend in the same direction as said projecting ridges.

The second embodiment of the present invention provides electronic equipment comprising equipment elements and a housing for accommodating the equipment elements, wherein the equipment elements include more than one kind of element for executing at least input or output of information between the element and an external apparatus, the housing has a configuration comprising a plurality of surfaces, at least one of said surfaces comprises a pattern of projections and depressions comprising an arrangement of a plurality of projecting ridges extending in the same direction and a plurality of depressed grooves generated between the respective adjacent ridges, and at least one opening that opens in the middle of the pattern of projections and depressions, two edges of which are aligned in the same direction as said projecting ridges.

DESCRIPTION OF THE PREFERRED EMBODIMENTS

Figure 1:
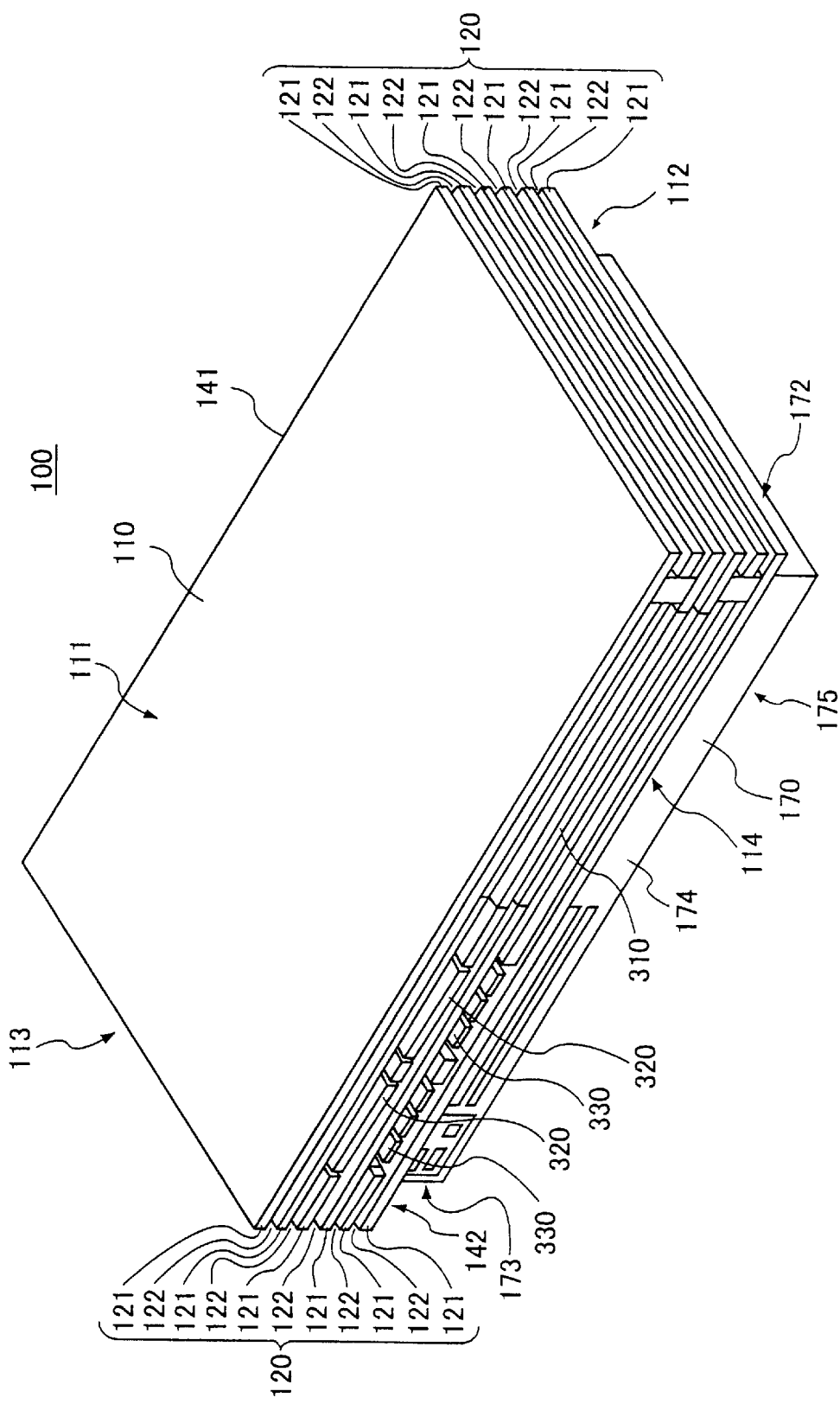
FIG. 1 is a perspective view showing an example of the appearance according to an embodiment of the present invention.

Referring now to the drawings, an embodiment of the present invention will be described. In the following embodiment, an entertainment system type electronic equipment and a housing for accommodating the entertainment system are described as an example. Though the present invention is not limited to the entertainment system, it is needless to say that the present invention is more effective when it is applied to a system used extensively by the general public such as an entertainment system.

The entertainment system according to the first embodiment of the present invention has a generally flat box structure, as shown in FIG. 1. FIG. 1 shows the entertainment system in landscape orientation. The entertainment system of this embodiment is explained in landscape orientation as a standard orientation, but it is not limited thereto. It is also possible to place it for example in portrait orientation. In this case, the entertainment system is placed with the portion shown as a right side surface in FIG. 1 is assumed to be the upper surface. It may also be placed in other ways.

Figure 2:
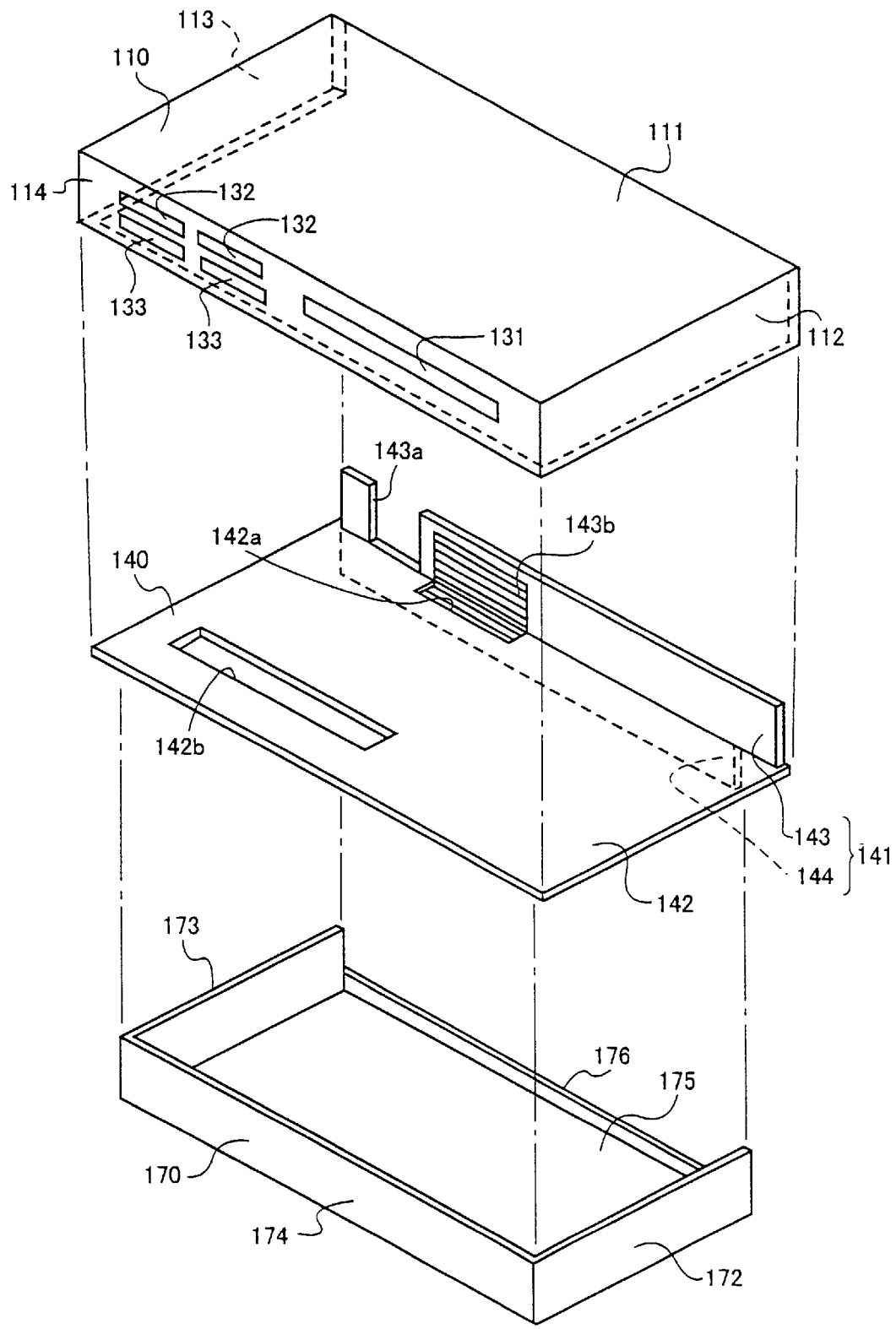
FIG. 2 is an exploded perspective view of a housing used in an embodiment of the present invention.

A housing 100 includes a member constituting a plurality of surfaces surrounding a space for accommodating equipment elements. The configuration of the housing 100 is formed from these members. The housing 100 comprises three portions as shown in FIG. 2. That is, the housing 100 comprises an upper housing 110, a center chassis 140, and a lower housing 170.

Figure 4:
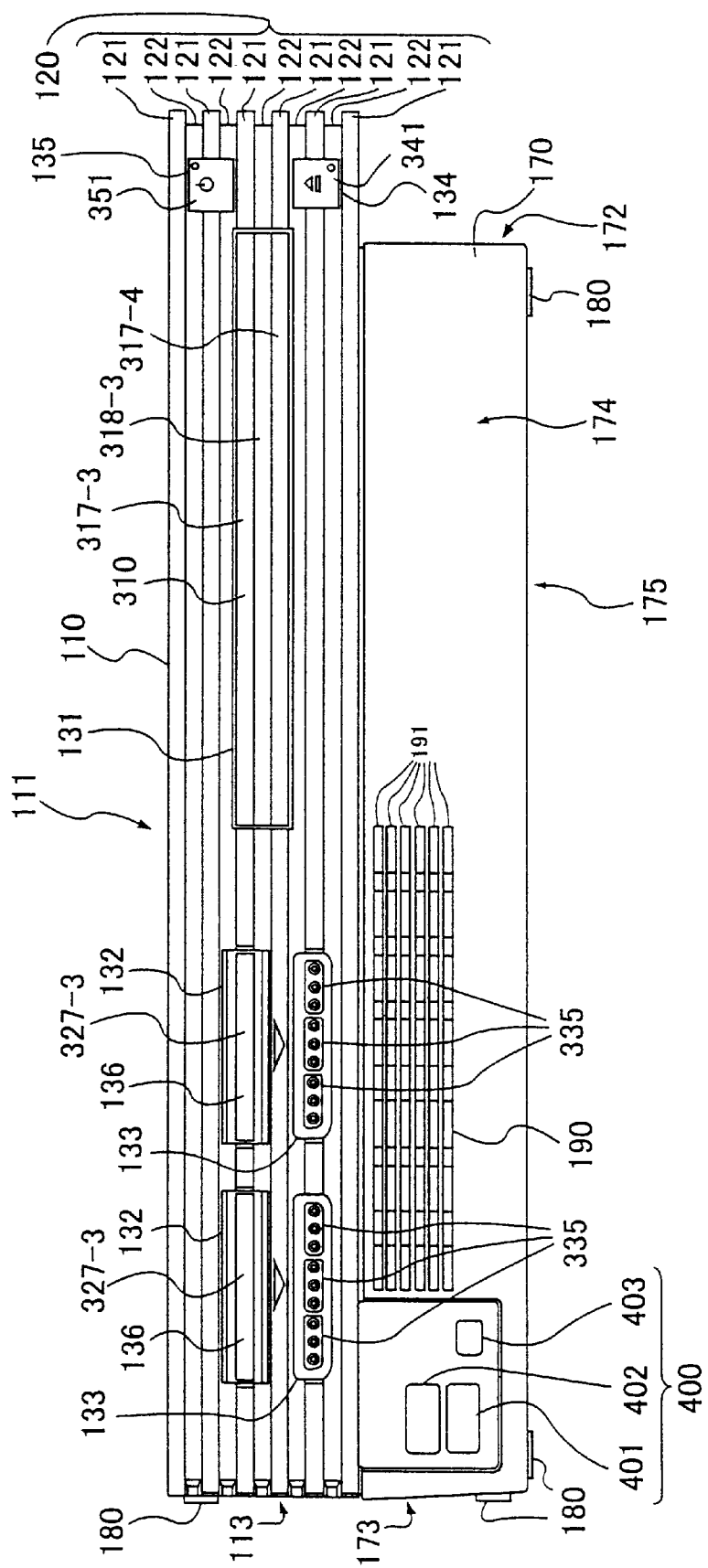
FIG. 4 is a front view showing the embodiment of the present invention.
Figure 6:
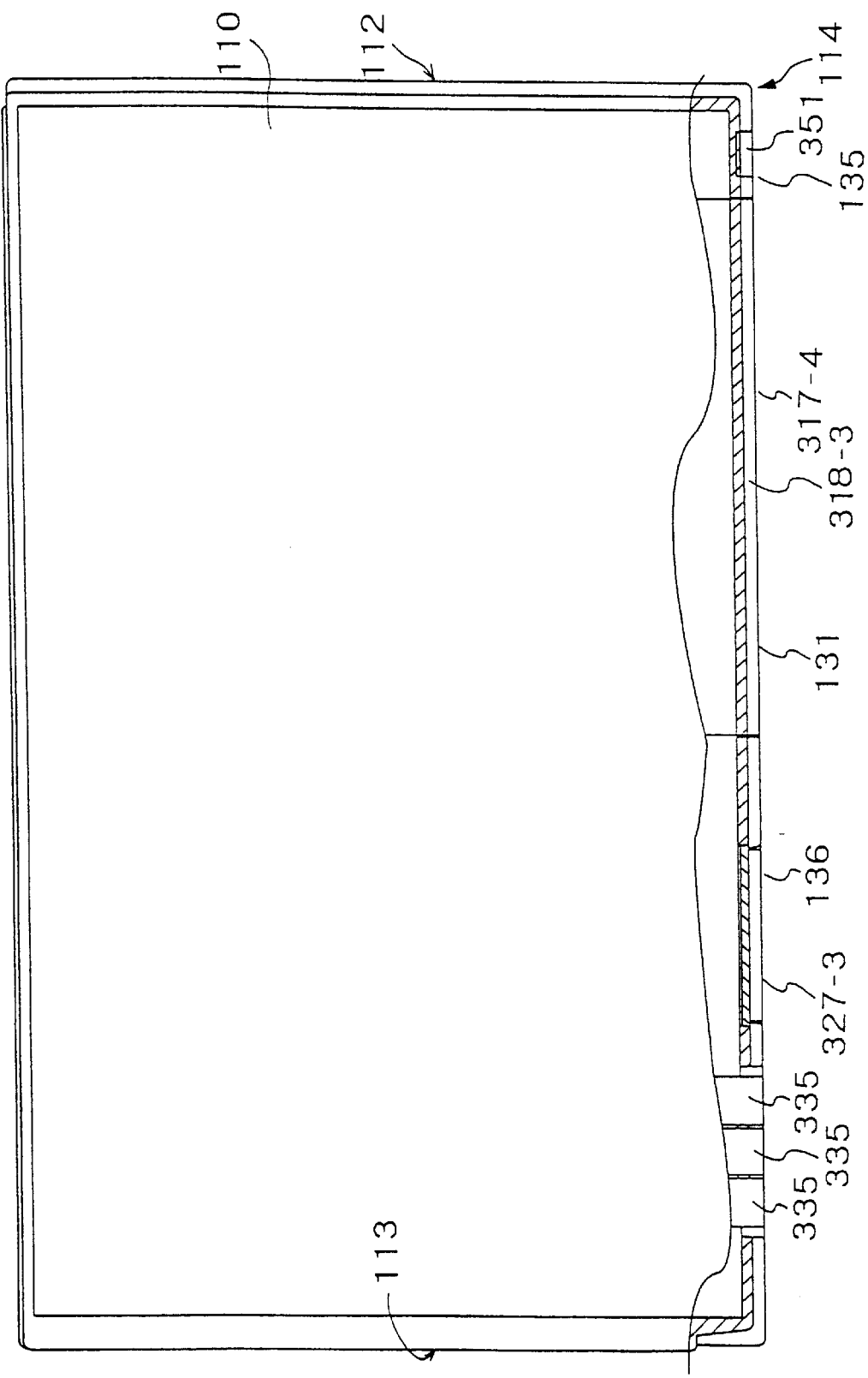
FIG. 6 is a cut-away plan view of the housing used in the embodiment of the present invention viewed from above showing different levels at different positions.
Figure 7:
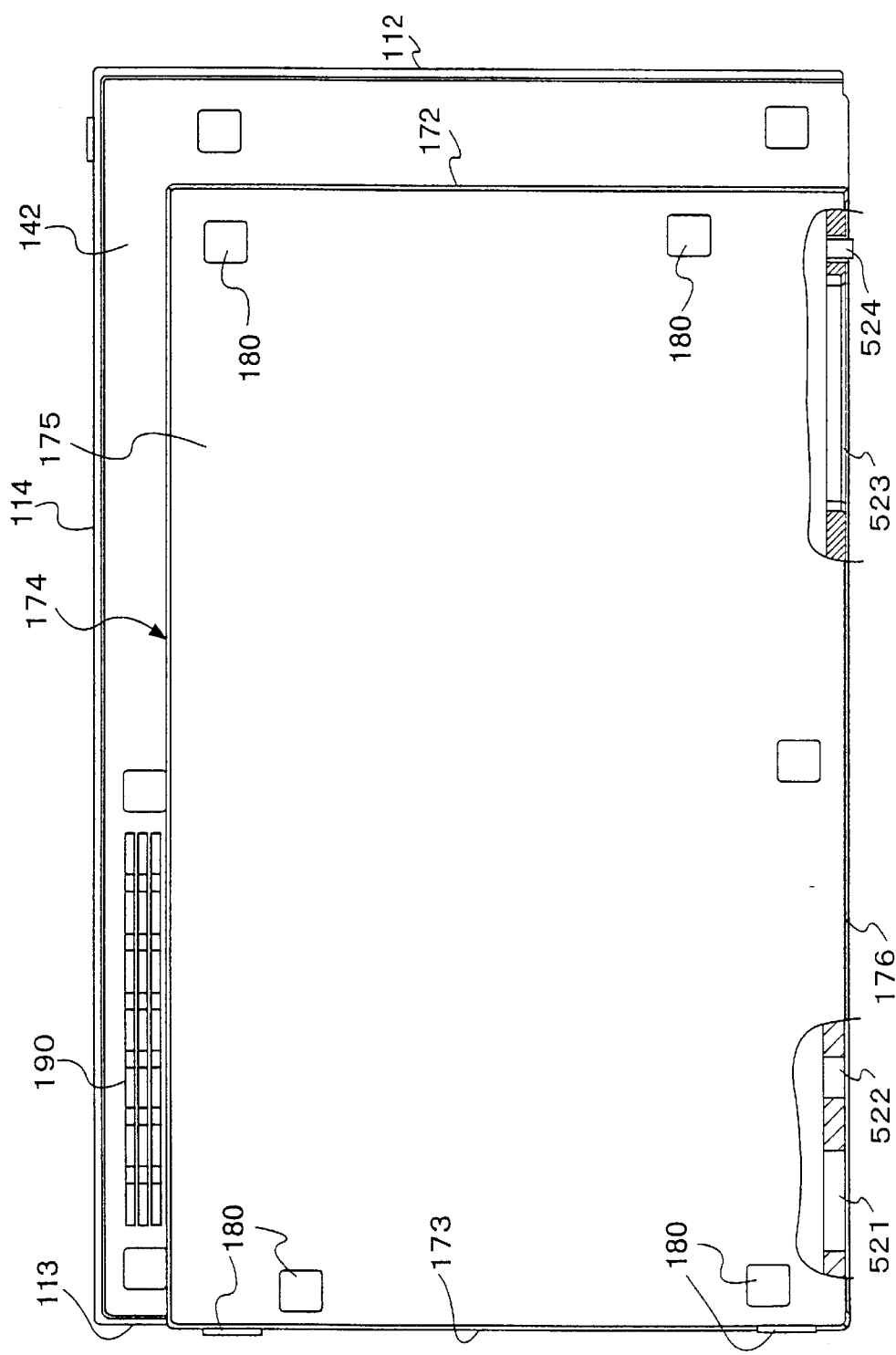
FIG. 7 is a cut-away bottom view of the housing in the embodiment of the present invention viewed from the bottom side.

In this embodiment, both of the upper housing 110 and the lower housing 170 are generally flat rectangular parallelepiped in shape. When placed in landscape orientation as shown in FIG. 1, the area of the bottom surface of the upper housing 110 is larger than that of the lower housing 170. The positional relationship between lower housing 170 and the center chassis 140 is such that the left side surface 173 and the rear side surface 176 of the lower housing 170 are aligned with the left side surface 113 of the upper housing 110 and the back surface of the center chassis 140 respectively as shown in FIG. 7. In other words, when the housing is seen from the front, the position of the lower housing 170 is leaning to the left side as shown in FIG. 4, and to the rear side as shown in FIG. 7. Therefore, as shown in FIG. 1, FIG. 2, FIG. 4, and FIG. 6, the upper housing 110 and the lower housing 170 are asymmetrically positioned with respect to the center chassis 140.

In this arrangement, the space for accommodating the equipment elements can be divided into the upper and the lower spaces by the center chassis 140. By making the upper housing 110 larger than the lower housing 170, more than one of equipment elements that require communications with an external apparatus may be placed in the upper housing. In addition, such equipment elements can be disposed in the lateral direction. Conventionally, the vertical cross-sectional configuration of this kind of electronic equipment were almost the same in principle. However, in this embodiment, dimensions of the upper housing 110 and the lower housing 170 are made different, and, as described above, the position of the lower housing 170 relative to the upper housing 110 is asymmetrical. As a result, it makes a novel impression to the viewers.

The upper housing 110, the center chassis 140, and the lower housing 170 are fixed with respect to each other by inserting bolts, not shown, from the center chassis 140 and from the lower housing 170 respectively and engaging them to the tapped holes, not shown, provided on the upper housing 110.

The center chassis 140 is formed by processing for example a metal plate, but not limited thereto. For example, it is also possible to form a portion of the center chassis from a metal plate and the remaining portion from a resin.

The upper housing 110 and the lower housing 170 may also be formed by processing a metal plate in the same manner, but as a matter of course, it is not limited thereto. For example, they may be formed by processing a resin as well. It is also possible to form the upper housing from a resin and the lower housing by processing a metal.

Figure 5:
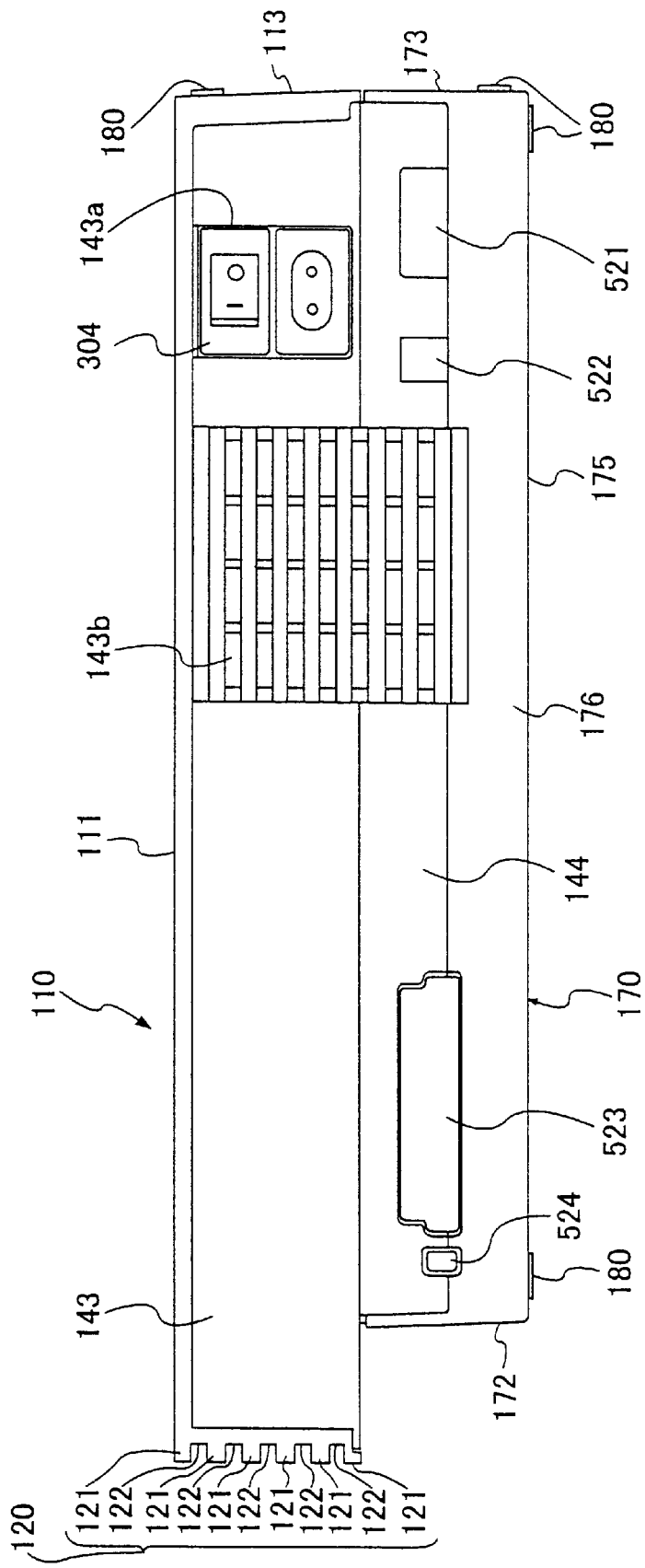
FIG. 5 is a rear view showing the embodiment of the present invention.
Figure 12:
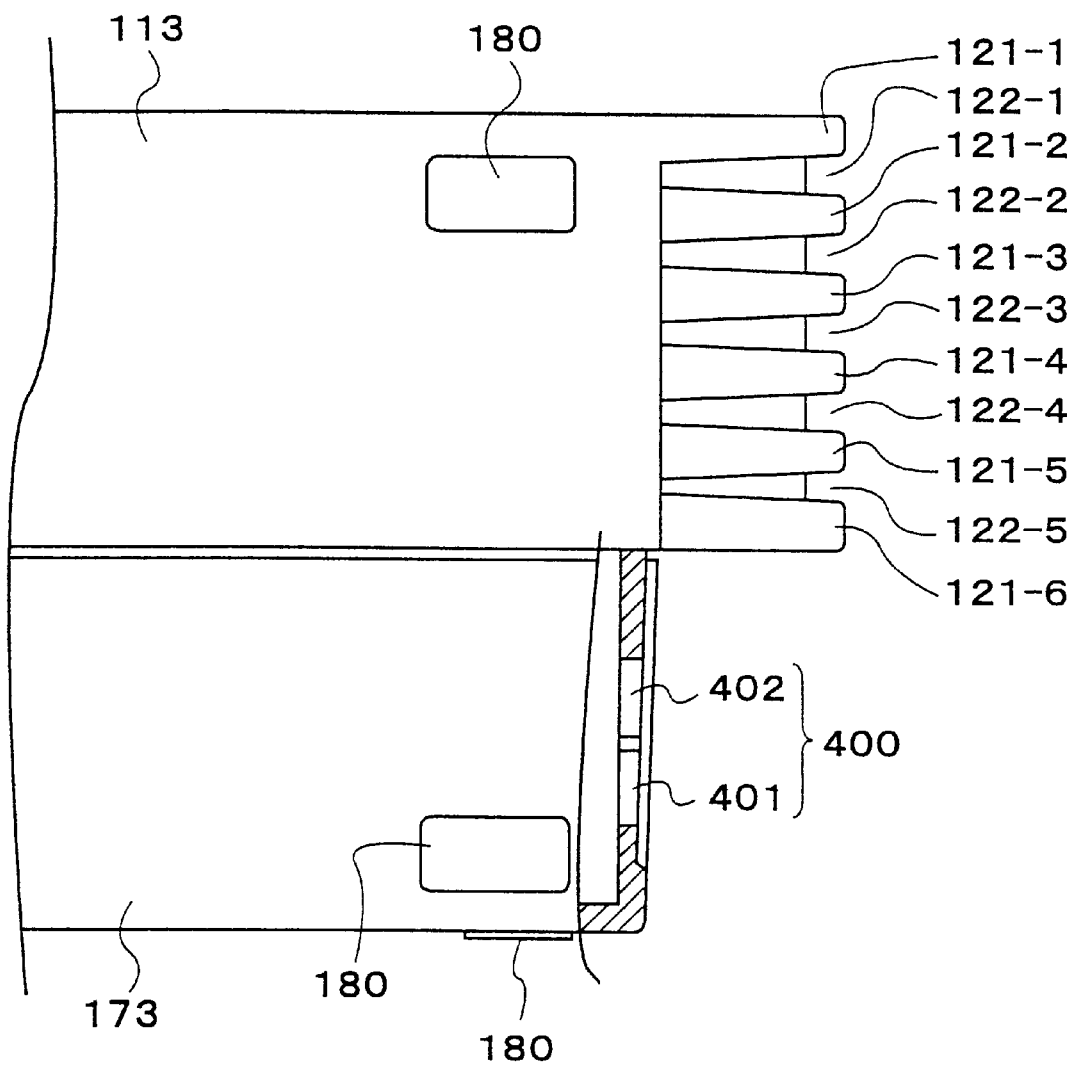
FIG. 12 is a partial cross-sectional view of the housing showing a socket connector portion on the rear side for mounting a plug of an external interface.

As shown in FIG. 4, FIG. 5, and FIG. 7, on the bottom surface 175 of the lower housing 170, there is provided leg members 180 to be used as legs when placed in landscape orientation. As shown in FIG. 4 and FIG. 12, on the left side surface 173 of the lower housing and the left side surface 113 of the upper housing 110, there are provided leg members 180 to be used as legs when placed in portrait orientation.

Figure 13:
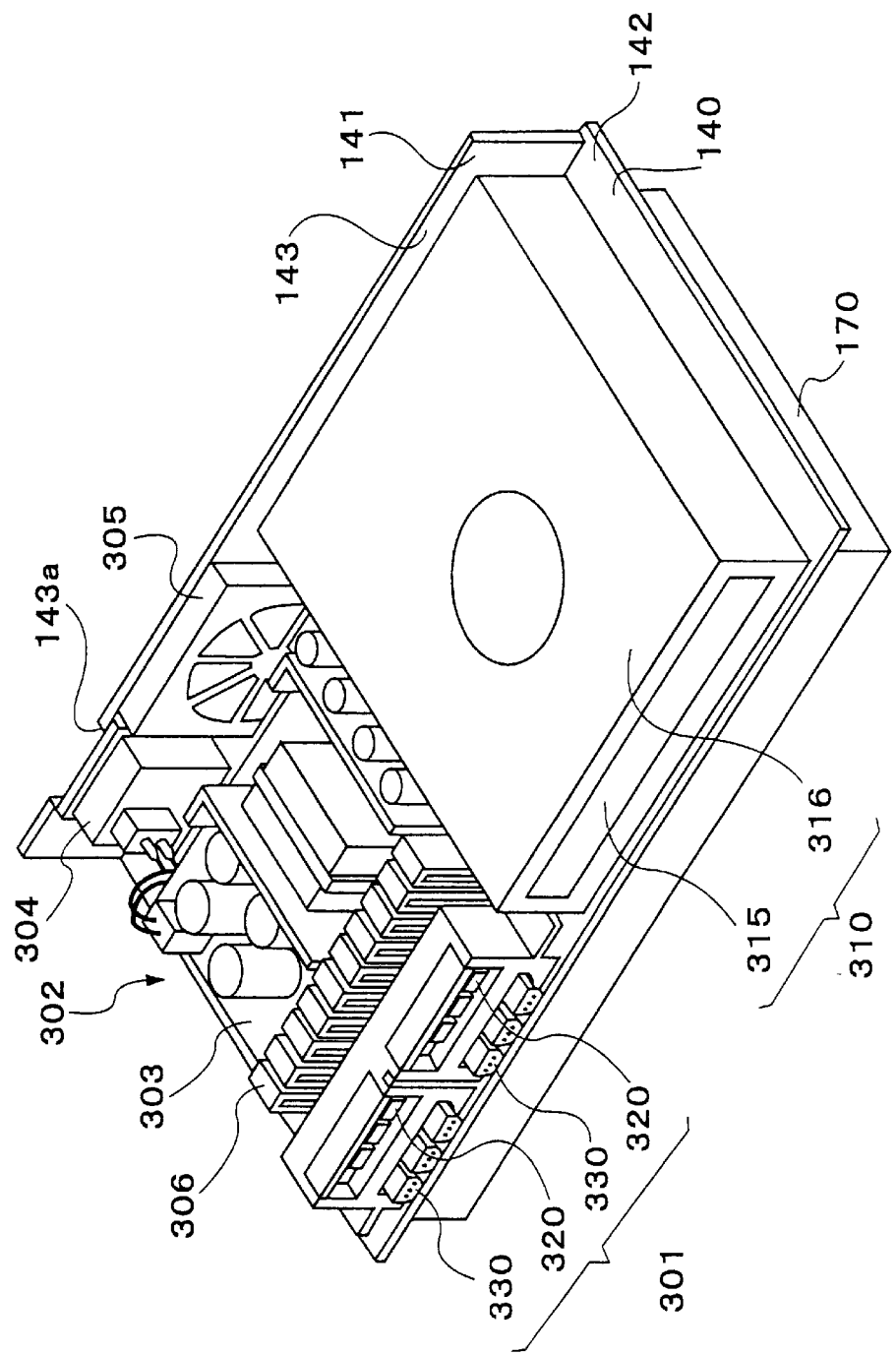
FIG. 13 is a perspective view showing a circuit structure of an equipment body accommodated in the housing of the embodiment.

The center chassis 140 has a back surface portion 141 and a partition 142. The partition 142 divides the storage space into the upper housing side 110 and the lower housing side 170. In the upper housing defined by the partition 142, various equipment elements, such as, a recording medium drive unit (disk unit) 310 having at least a capability to reproduce the disk-type recording medium such as CD or DVD, a connector unit 301 having socket connectors 320 and 330, a power unit 302, and a switch inlet unit 304 and a power circuit board 303 are accommodated as shown in FIG. 13.

The recording medium drive unit 310 comprises a retractable tray 315 and a disk unit body 316 storing the tray 315 therein and having a reproducing portion (not shown) for reproducing data recorded in a disk such as CD or DVD. The tray 315 is mounted so that it is retractable through the opening 131 that is described later. Loading and unloading of the recording medium with respect to the tray 315 is made from outside.

Figure 14:
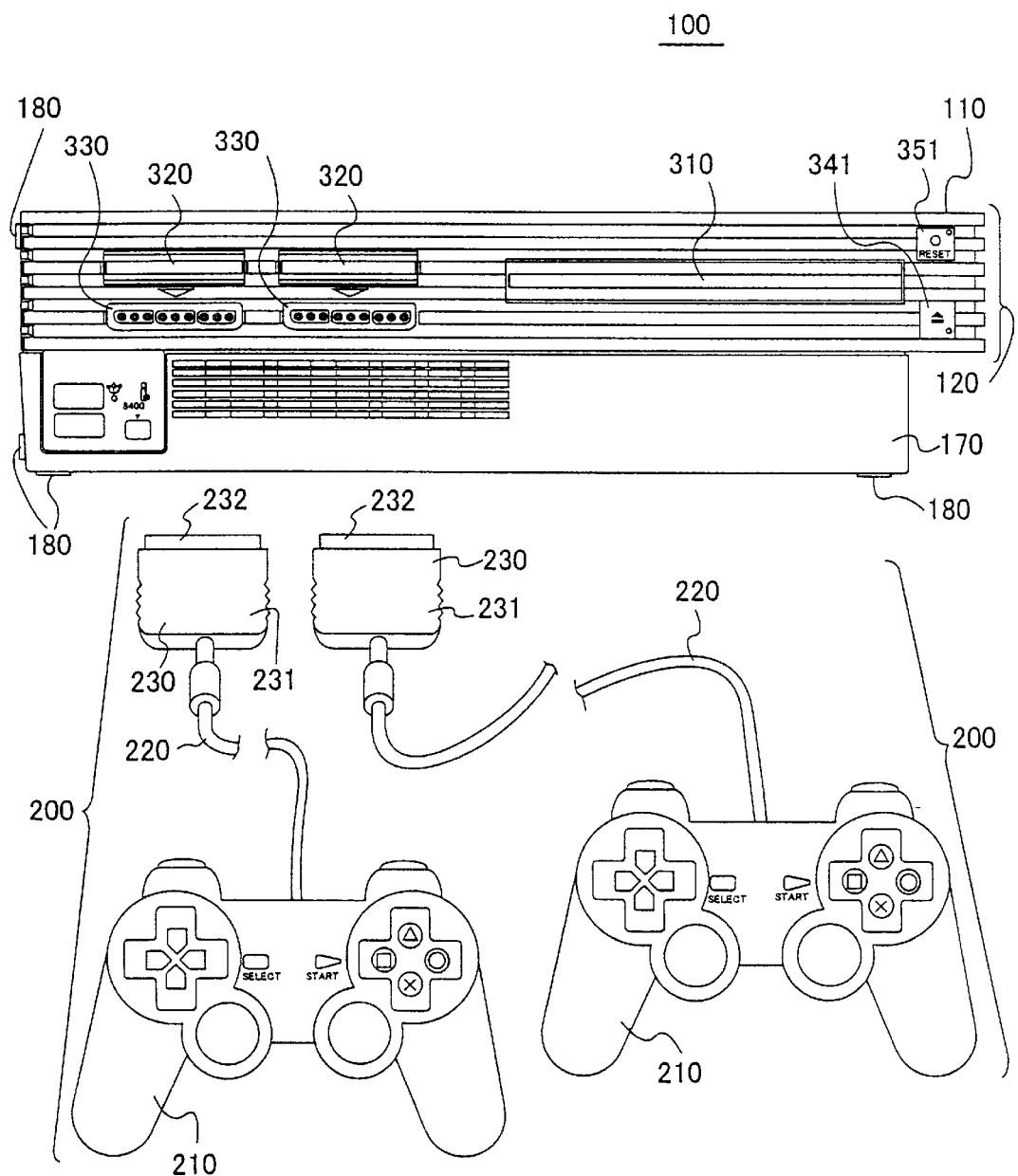
FIG. 14 is a front view showing an example of an entertainment system as electronic equipment according to the embodiment.

The socket connector 320 provided in the connector unit 301 is a connector for mounting a recording device (not shown) for recording and reproducing data, as an external device. In other words, the socket connector 320 receives the recording device inserted from an opening 132 that is described later and detachably holds the recording device and make electrical connection therewith. The socket connector 330 receives a plug connector inserted from an opening 133 and detachably holds the plug connector and makes electrical connection therewith. The plug connector may be for example a plug connector 230 as shown in FIG. 14. The plug connector 230 is connected via a cable 220 to a controller body 210. The plug connector 230 is constructed so that a connector terminal 232 is stored within a housing 231.

The center chassis 140 is provided with a through hole 142b and slitted portion 142a (see FIG. 2). A radiating fin 306 which is mounted in the lower housing 170 (see FIG. 13) passes through the through hole 142b, so that the upper portion of the radiating fin 306 projects into the space in the upper housing 110. At the position of the slitted portion 142a, an exhaust fan 305 is disposed as will be described later.

As shown in FIG. 5, the back surface portion 141 comprises an upper back surface member 143 and the lower back surface member 144. The upper back surface member 143 and a lower back surface member 144 are, in this embodiment, provided at a right angle with respect to the partition 142 respectively. There is provided a slitted portion 143a on the upper back surface member 143 as shown in FIG. 2. A switch inlet unit 304 is mounted to the slitted portion 143a (see FIG. 5, and FIG. 13). As shown in FIG. 5, an exhaust port 143b is provided at the position corresponding to the slitted portion 142a, and an exhaust fan 305 is mounted to the exhaust port 143b. On the lower back surface member 144, as shown in FIG. 5 and FIG. 7, there are provided a video sound output terminal 521 for output audio-sound signals, a communication terminal 522 for communicating with external apparatuses, a PCMCIA slot 523 in which various card-type peripheral devices based on the PCMCIA standard is to be inserted, and an eject button 524 for the mounted card.

A main board and an I/O signal control board are stored in the lower housing 170. As shown in FIGS. 4 and 12, a socket connector unit 400 for mounting a plug of an external interface such as the USB (Universal Serial Bus) or the IEEE 1394 is provided in the lower housing 170. In the socket connector unit 400, USB connectors 401 and 402, and IEEE 1394 connector 403 are disposed. By disposing these connectors on the front portion, ease of operation is improved in association with the arrangement of the equipment elements described above.

Figure 11:
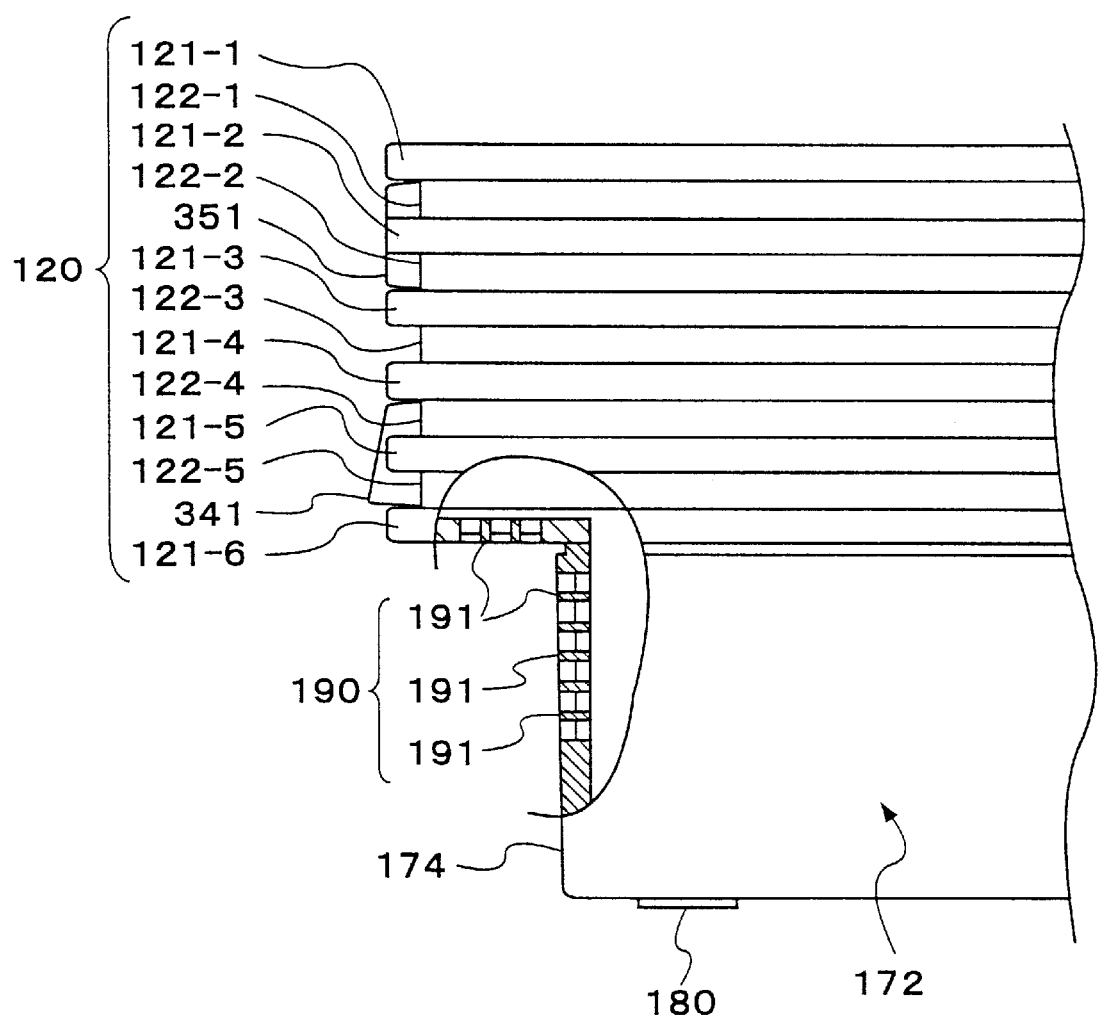
FIG. 11 is a partial cross-sectional view of the housing showing an exhaust port on the front portion thereof.

An air inlet 190 is provided on the lower housing 170. As shown in FIG. 11, another air inlet 190 is provided on the bottom surface 142 of the upper housing 110 adjacent to the air inlet 190. A grid pattern is provided with the air inlet 190, and the pitch of the laterally pitched grid 191 of the grid pattern may be conformed to the pitch of the projecting ridges 121 of the pattern of projections and depressions 120 on the upper housing 110 that will be described later. As a result, the consistency of the design on the front face of the housing is further improved.

Figure 3:
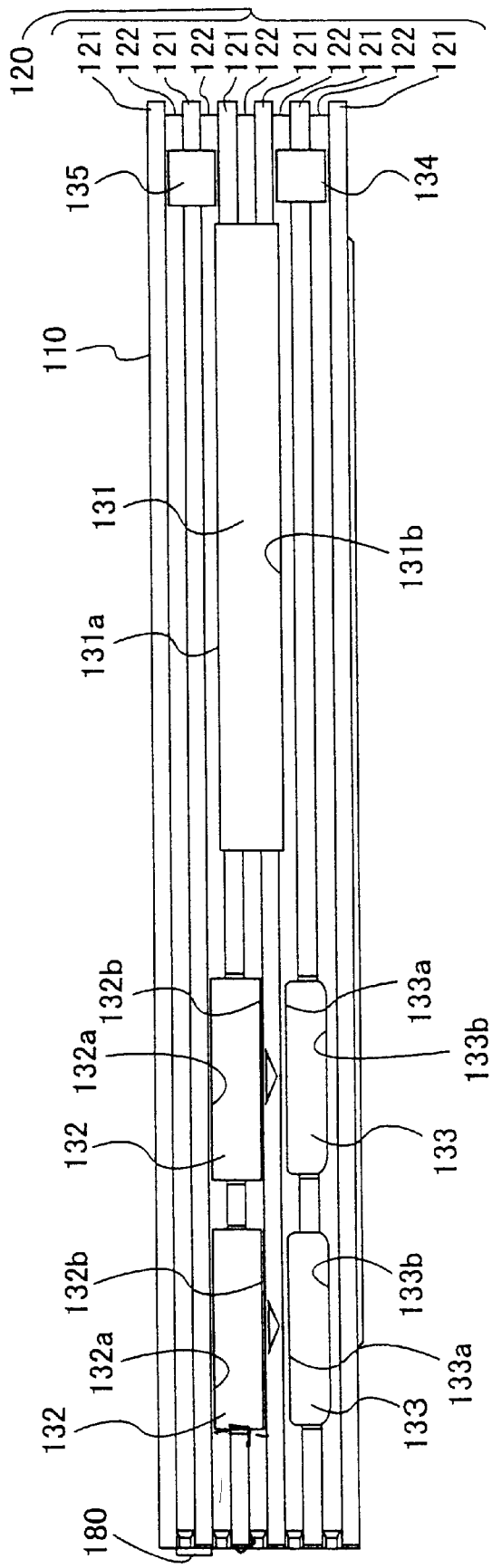
FIG. 3 is a front view showing the upper housing in the embodiment of the present invention.

The upper housing 110 is a box-shaped configuration comprising an upper surface portion 111, the right side surface portion 112, the left side surface portion 113, and the front face portion 114, and the back surface side thereof is open. As shown in FIG. 3, openings 131–133 are provided on the front face portion 114 that is one of the surfaces of the upper housing 110, and external units are to be mounted to each of the openings.

Figure 9:
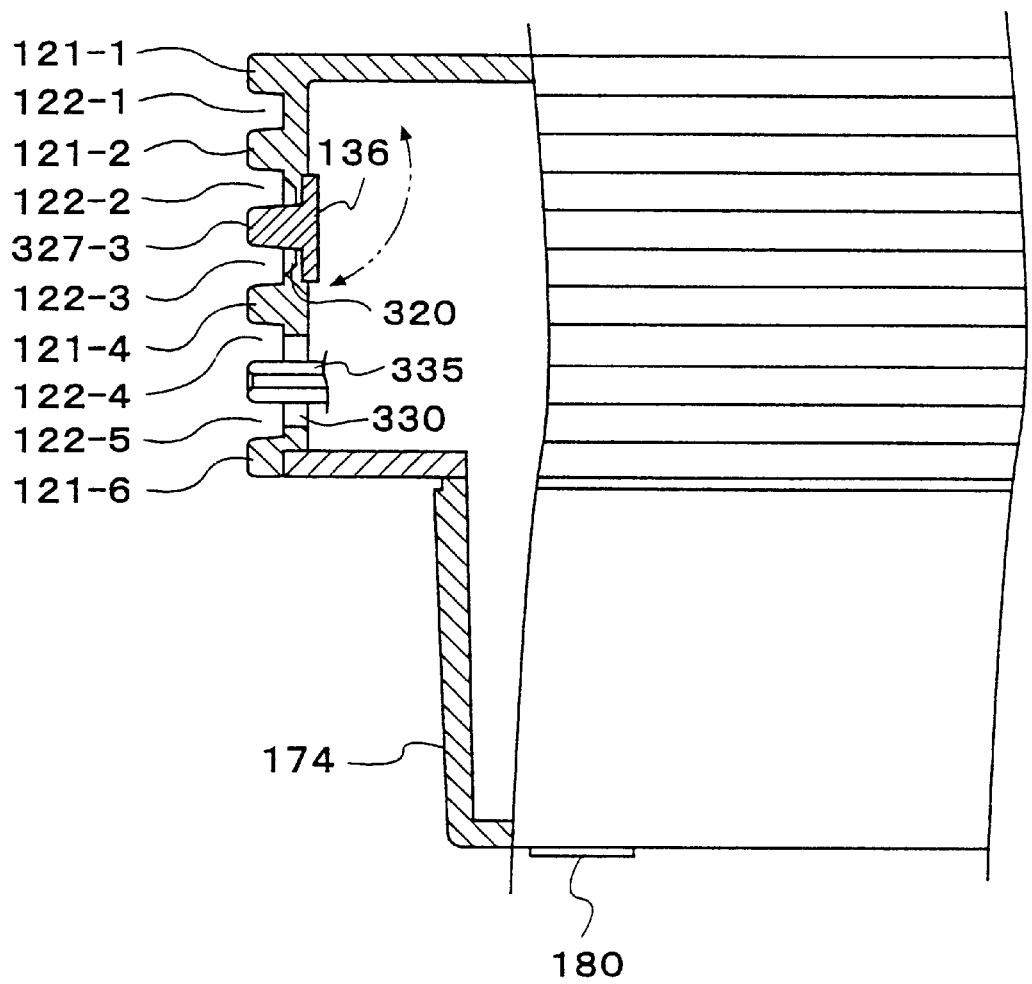
FIG. 9 is a partial cross-sectional view of the upper housing showing a cross sectional configuration of the front portion where a connector plug for the recording unit is disposed.

An opening 311 is disposed at a position where the tray 315 (see FIG. 13) of the recording medium drive unit 310 described above can be retractably mounted, and formed in a configuration and dimensions through which the tray 315 can be opened and retracted. The openings 132 and 133 are disposed at the positions corresponding to the socket connectors 320 and 330 respectively of the connector unit 301 described above. The opening 132 is provided with a shutter 136. The shutter 136 is, as shown in FIG. 9, supported on one side 132a of the opening 132 so that it can be shunned into the socket connector. The shutter 136 is urged by an elastic member (not shown) so that it covers the opening when the recording device is not inserted therein. The socket connector 330 is provided with a terminal 335 to be connected with the plug connector.

Figure 10:
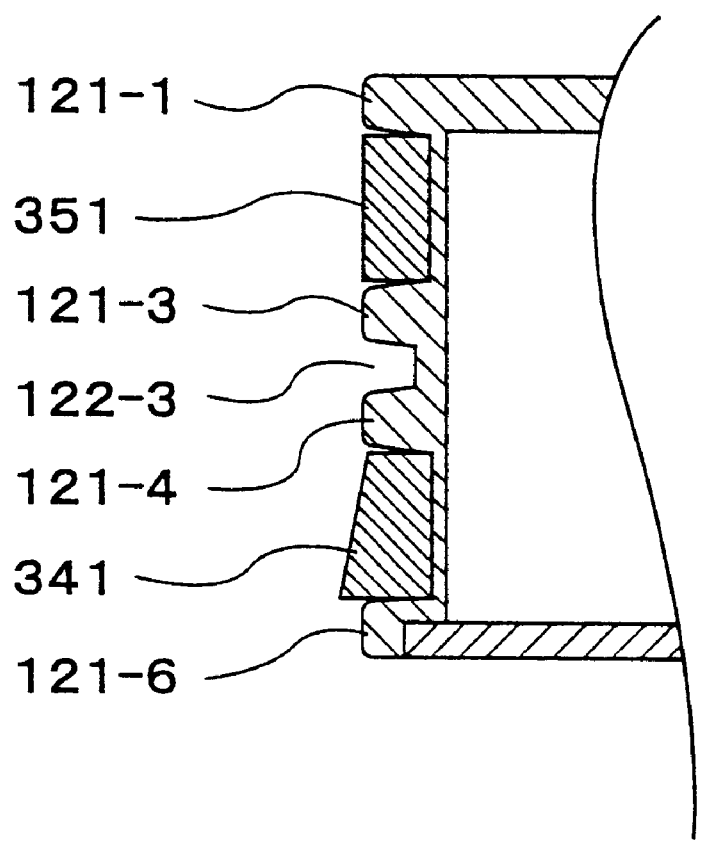
FIG. 10 is a partial cross-sectional view of the upper housing showing a cross sectional configuration of the front portion where a controlling portion is disposed.

Though it is not shown in FIG. 2, openings 134 and 135 are provided on the front face 114 of the upper housing 110 (see FIG. 3). It the openings 134 and 135, key tops 341 and 351 of the an operation unit are mounted as shown in FIG. 4. More specifically, as conceptually shown in FIG. 10, the key top 351 is disposed at a space between the projecting ridges 121-1 and 121-3, and the key top 341 is disposed at the space between the projecting ridge 121-4 and 121-6. In this embodiment, the key top 341 is allocated to an eject button for the tray 315 (see FIG. 13) of the recording medium drive unit 310. The key top 351 is allocated to the power switch and reset switch. In this arrangement, the design conformity between the operation unit and the pattern of projections and depressions 120 may be ensured.

As shown in FIGS. 1, 3, 4, 5, 9 and 11, the front face portion 114 of the upper housing 110 is provided with a pattern of projections and depressions 120 constituted by an arrangement of a plurality of projecting ridges 121 extending in the same direction. In this embodiment, the right side surface portion 112 is also provided with the pattern of projections and depressions 120 as well as on the front face portion 114. The pattern of projections and depressions 120 may be provided on other surfaces, such as the left side surface portion 113. It is also possible to provide a back surface portion on the upper housing 110, and to provide the pattern of projections and depressions thereon as well. The pattern of projections and depressions 120 may be formed in any way. For example, the pattern of projections and depressions may be formed by providing the projecting ridges 121 when fabricating the member that constitutes the upper housing 110. It can be provided by forming the projecting ridges 121 when forming the upper housing 110, or else the pattern of projections and depressions 120 may be formed independently of the upper housing 110. In such a case, the formed pattern of projections and depressions 120 may be mounted on the outer surface of the upper housing 110.

The reason why the pattern of projections and depressions is provided on the front face portion 14 in this embodiment is as follows.

Firstly, the portions of the recording medium drive unit 310 and the socket connectors 320, 330 that are exposed to the outside are integrated into a part of the design, so that they do not give a mismatched impression to the user even when they are disposed on the front face portion, but do give a rather novel impression. Therefore, in this embodiment, the recording medium drive unit 310 and the socket connectors 320, 330 are disposed horizontally when the system is placed in landscape orientation, and vertically when the system is placed in portrait orientation, and the pattern of projections and depressions 120 is formed in such a manner that it extends in the same direction as the disposition of the recording medium drive unit 310 and the socket connectors 320, 330, so that the arrangement of the recording medium drive unit 310 and the socket connectors 320, 330 exhibits a design consistency, thereby increasing an affinity between the user and the system. Generally, it has been believed that the shutter and connector should be designed giving priority to their performance, and that the configuration thereof and the visual design are mutually conflicting. Therefore, the shutter or the connector has been disposed on the surface that is out of sight of the user, such as the back surface or the side surface of the system. However, since the equipment elements disposed on the back surface cannot be seen easily from the user, there has been a problem in that they are not easy to use. Especially this problem is noticeable for the equipment elements that are connected and detached frequently. Therefore, in the present invention, the shutter of the opening portions and the connector are incorporated into the designing elements. That is, the pattern of projections and depressions is formed on the front face in order to take advantage of geometrical feature of these elements. As a result, the shutter of the opening and the connector do not impair the visual appearance as a mater of course, it enables to dispose these elements positively on the front face portion as one of the elements that constitute its original design.

Secondly, by providing the pattern of projections and depressions 120 on the front face 114, the housing gives the impression to the user that it is sharp as a whole. In other words, since the projecting ridges 121 of the pattern of projections and depressions 120 serves as ribs, the surface having such ribs is expected have an increased strength. As a consequence, in addition to the actual effect thereof, it gives the user the impression that the strength of the surface is increased. Even when the rib is not necessary to increase the structural strength of the housing, existence of the projecting ridge 121 has an effect to give the user a feeling of being safe that the housing has a sufficient strength.

On the front face portion 114 of the housing, there are provided with the portions in which insertion and removal of the object from the outside is frequently made, such as the recording medium drive unit 310 and the socket connector 320, 330. These portions are subjected to force very often. These portions may be subjected to strong impact due to rough handling. In such a case, the projecting ridges 121 serves as ribs, thereby improving impact-resistance of the front face portion 114. Therefore, in the present invention, by providing the pattern of projections and depressions 120 on the front face 114 of the housing 110, the equipment elements, which are subjected to the attachment and detachment very often, may be disposed in the front face portion of the system, thereby providing ease-of-use to the user.

The relation between the pitch of the pattern of projections and depressions 120 and the equipment elements disposed on the front face portion 114 will now be described.

As shown in FIG. 3, on the front face portion 114 of the upper housing 110, there are provided a plurality (six, in case of FIG. 3) of lateral (in case of landscape orientation) projecting ridges 121 at regular intervals (The width of the interval is about the same as the width of the projecting ridges in case of FIG. 3). The portions between the adjacent projecting ridges form depressed grooves relative to those projecting ridges. In other words, in this embodiment, the projections and the depressions are disposed at regular pitches The cross section of the pattern of projections and depressions 120 is formed, for example, as a square wave, but it is not limited thereto. For example, it is also possible to make the width of the distal end of the projecting ridge 121 smaller than that of the proximal end thereof. That is, the depressed groove 122 is formed in a tapered configuration. It is also possible to round the edge of the projecting ridge 121.

The width of the projecting ridge 121 and the pitch of the pattern of projections and depressions 120 are defined so that they are matched with the openings 130–133 for accommodating the equipment elements, for example as in FIG. 3. Namely, it is necessary to provide an opening of a proper configuration and dimensions for the tray 315 of the recording medium drive unit 310 to open and close. Regarding the socket connectors 132,133, it is necessary to provide openings of a proper configuration and dimensions for mounting the recording unit and the plug connector. On the other hand, the projecting ridges 121 have to extend continuously as much as possible from a design point of view. When considering that the projecting ridges serve as ribs for increasing impact resistance, it is desired to dispose narrow projecting ridges 121 at high density. The inventors have realized the present invention as a result of their research to fulfill these conditions.

Figure 8:
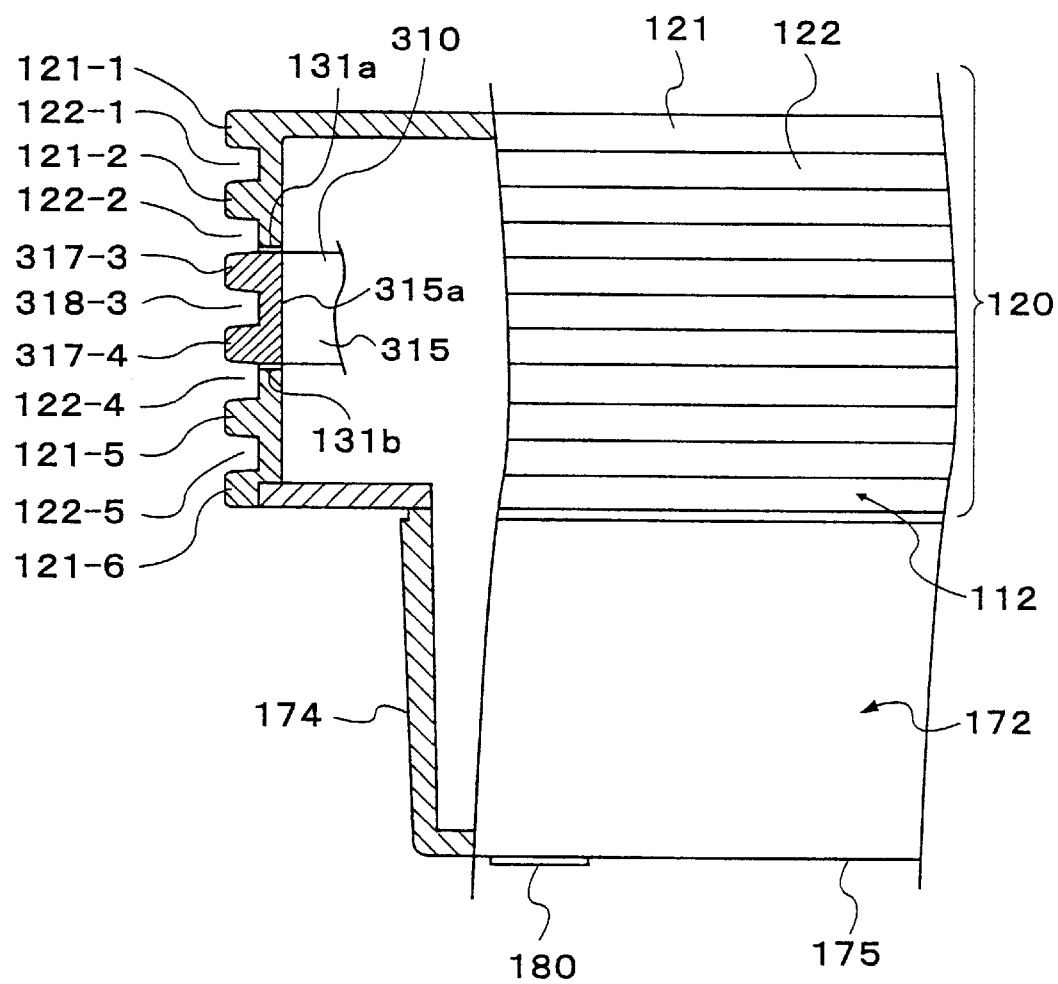
FIG. 8 is a cut-away side view of the upper housing showing the portion where the recording medium drive unit is mounted.

As shown in FIG. 3, in the present invention, the pitch of the projecting ridges 121 are selected so that the sides 131a, 131b, 132a, 132b, 133a, 133b of the each openings 131–133 extending along the projecting ridges 121 are positioned in the depressed grooves 122 respectively. More specifically, as shown in FIG. 8, the opening 131 has the side 131a located in the depressed groove 122-2 and the side 131b located in the depressed groove 122-4. As shown in FIG. 9, the opening 132 has its side 132a located in the depressed groove 122-2 and its side 132b located in the depressed groove 122-3. In addition, the opening 133 has its side 133a located at the depressed groove 122-4 and the side 133b located in the depressed groove 122-5. Accordingly, as shown in FIGS. 3, 8, and 9, extensions of the projecting ridges 121-3, 121-4, an extension of the depressed groove 122-3 pass through the opening 131, an extension of the projecting ridge 121-3 passes through the opening 132, and an extension of the projecting ridge 121-5 passes through the opening 133.

In this embodiment, as described above, the pitch of the projecting ridges 121 are determined so that the two opposite sides of the opening are located in the corresponding depressed grooves 122 respectively. In such a case, the width of the projecting ridge 121 and/or the depressed groove 122 are determined from a design point of view so that the conditions described above are satisfied. In this embodiment, it is determined to be approximately a half the pitch of the projections and depressions. In other words, the widths of the projecting ridge 121 and of the depressed groove are determined to be almost the same. Of course, the pitch of the projecting ridges, the widths of the projecting ridges and of the depressed grooves are not limited thereto.

According to this embodiment, the openings 131–133 for accommodating the equipment elements and the pattern of projections and depressions 120 are aligned with consistency, and all the two sides of the openings 131–133 parallel to the direction in which the projecting ridges extend are located in the depressed grooves. As a consequent, the openings may be disposed without disruption of the noticeable configuration of the projecting ridges, thereby maintaining the consistency in terms of design. As a result, the front face of the housing may be configured to be convenient for the user as well as to give a novel impression to the user. By providing the openings in the depressed grooves 122, the two sides of the openings located in the depressed grooves 122 are positioned in the shadows of the projecting ridges, thereby being unobtrusive to the user. Therefore, such openings have little effect on the design. In addition, since the edges of the openings are located in the depressed groove, which is smaller in thickness, it is easy to process.

The above description is made assuming the case where the housing 100 is placed in landscape orientation. However, this embodiment is also applicable to the case where the housing 100 is placed in the portrait orientation. When placing the housing in portrait direction, as described above, the housing is raised upright on the leg members 180 by making the left side surface 113 when placed in landscape direction the bottom surface of the housing, which now becomes the bottom surface. In such a case, since the front face portion 114 is still facing to the front, the same argument as in the case of landscape orientation can be held. When placed in portrait direction, the right side surface 112 in landscape direction becomes the upper surface. In this embodiment, as shown in FIG. 1, since the pattern of projections and depressions 120 is formed on the right side surface 112 as well, the pattern of projections and depressions 120 comes to be on the upper surface when placed in portrait direction. Therefore, the user can easily distinguish which side is up, and placing the housing 110 upside down by mistake can be prevented.

At the opening 131, the front face of the tray 315 of the recording medium drive unit 310 to be mounted therein is placed, and at the opening 132, the shutter 136 is placed. In this embodiment, in order to improve the consistency of the design, the front face 315a of the tray 315 and the front face of the shutter 136 are provided with the projecting ridges of the same material, the same width and pitch, and the same color as the pattern of projections and depressions 120, as shown in FIG. 8 and FIG. 9. In other words, in the front face 315a of the tray 315 is provided with the projecting ridges 317-3, 317-4, and the depressed groove 318-3 generated therebetween. The projecting ridges 317-3 and 317-4 are aligned with the projecting ridges 121-3 and 121-4 respectively, of which extensions pass through the opening 131. The shutter 136 is provided with a projecting ridge 327-3. The projecting ridge 327-3 is aligned with the projecting ridge 121-3 of which an extension passes through the opening 132. FIG. 6 shows the plan view of the upper housing 110 with the front face 114 thereof broken away at different positions.

It is also possible to change the color or the configuration of the projecting ridges 317-3, 317-4, and the projecting ridge 327-3 for variety.

In this way, when the tray 315 is in the retracted state, the projecting ridges 317-3 and 317-4 are aligned with the projecting ridges 121-3 and 121-4 respectively, so that it looks as if the projecting ridges 121-3 and 121-4 are continuously formed. When the shutter 136 is closed, the projecting ridge 327-3 is aligned with the projecting ridge 121-3, so that it looks as if the projecting ridge 121-3 is continuously formed. Consequently, the projecting ridges on the front face 114 of the upper housing 110 appear to be formed continuously, producing the visual effect that the housing appears to be robust and sharp, and gives a further enhanced original impression to the viewer.

The entertainment system according to this embodiment may be used as a game machine as one of its purposes. As shown in FIG. 14, the entertainment system according to the present invention constitutes a game machine with a main body 100, controllers 200, and the display unit not shown. While shown in FIG. 14 is the game machine that can be used for two-person game paly, the present invention is also applicable to the game machine for one-person game play. Therefore, there is a case where only one controller 200 is provided. In addition to the game, it is also possible to use the system for sound reproduction, video replay, or communications.

According to the present invention, the housing for electronic equipment of an original design having good functionality and usability can be provided. According to the present invention, electronic equipment having the form in which the visual design and the performance of the electronic equipment are well merged is provided.

What is claimed is:

1. A housing for accommodating electronic equipment elements comprising a member constituting a plurality of surfaces surrounding a space for accommodating said equipment elements, wherein at least one of a plurality of surfaces constituted by said member is provided with a pattern of projections and depressions comprising an arrangement of a plurality of projecting ridges extending respectively in the same direction and a plurality of depressed grooves generated between the respective adjacent projecting ridges, and at least one opening, two edges of said at lest one opening being aligned in the same direction as said projecting ridges, is disposed in the middle of this surface of said pattern of projections and depressions;

wherein one of said two edges of said opening is located in one of said plurality of depressed grooves, and the other of said two edges of said opening is located in another different depressed groove.

2. A housing according to claim 1,
wherein said opening has a configuration and dimensions for enabling insertion and removal of a disk-type recording medium.

3. A housing according to claim 1,
wherein said opening has a proper configuration and dimensions suitable for mounting a connector.

4. A housing according to claim 1,
wherein in that there are provided a plurality of said openings including a first opening having a configuration and dimensions for enabling insertion and removal of a disk-type recording medium, and a second opening having a proper configuration and dimensions suitable for mounting a socket connector.

5. A housing according to claim 4,
wherein in that said openings further include a third opening having a configuration and dimensions suitable for mounting a socket connector different from said socket connector.

6. A housing according to claim 1,
wherein said pattern of projections and depressions comprises said projecting ridges arranged at a regular pitch.

7. A housing according to claim 2, further comprising an upper housing and a lower housing, wherein said one of the plurality of surfaces is one of the surfaces that constitute said upper housing.

8. A housing according to claim 2, further comprising an upper housing, a lower housing, and a center chassis for dividing these, wherein said one of the plurality of surfaces is one of the surfaces that constitute said upper housing.

9. A housing for accommodating electronic equipment elements comprising:

a member constituting a plurality of surfaces surrounding a space for accommodating said equipment elements, wherein at least one of a plurality of surfaces constituted by said member is provided with a pattern of projections and depressions comprising an arrangement of a plurality of projecting ridges extending respectively in the same direction and a plurality of depressed grooves generated between the respective adjacent projecting ridges, and at least one opening, two edges of said at least one opening being aligned in the same direction as said projecting ridges is disposed in the middle of this surface of said pattern of projections and depressions;

wherein one of said two edges of said opening is located in one of said plurality of depressed grooves, and the other of said two edges of said opening is located in another different depressed groove; and wherein said openings are provided at a plurality of locations, and at least one of said openings includes a shutter for closing and opening said opening as desired, and a second projecting ridge is provided on the outer surface of said shutter.

10. A housing according to claim 9,
wherein said second projecting ridge is aligned in the same direction as the projecting ridges that constitute said pattern of projections and depressions.

11. Electronic equipment comprising equipment elements and a housing for accommodating said equipment elements, wherein among said equipment elements are included at least one element for executing at least input or output of information between said equipment element and an external apparatus, said housing has a configuration comprising a plurality of surfaces, at least one of said surfaces comprises a pattern of projections and depressions comprising an arrangement of a plurality of projecting ridges each extending in the same direction and a plurality of depressed grooves generated between the respective adjacent ridges, and at least one opening that opens in the middle of said pattern of projections and depressions, two edges of said at least one opening being aligned in the same direction as said projecting ridges;

wherein one of said two edges of said at least one opening is located in one of said plurality of depressed grooves, and the other of said two edges of said at least one opening is located in another different depressed groove.

12. Electronic equipment according to claim 11, wherein said equipment elements includes as said at least one element:
 a recording medium drive unit having a mounting portion for mounting a recording medium and reading information from said recording medium mounted in said mounting portion;
 a first socket connector for receiving mounting of a recording device for recording and reproducing data, and detachably retaining and electrically connecting said recording device; and
 a second socket connector for receiving a plug connector, and detachably retaining and electrically connecting said plug connector.

13. Electronic equipment according to claim 12, wherein there are provided a plurality of said openings;
at least one of said plurality of openings is a first opening wherein said mounting portion is retractable;
at least one of said plurality of openings is a second opening wherein said first socket connector can be mounted therein; and
at least one of said plurality of openings is a third opening wherein said second socket connector can be mounted therein.

14. Electronic equipment according to claim 13, wherein said pattern of projections and depressions comprises said projecting ridges arranged at a regular pitch.

15. Electronic equipment according to claim 11, wherein said housing includes an upper housing and a lower housing; and
said one of said surfaces is any one of the surfaces that constitute said upper housing.

16. Electronic equipment according to claim 11, wherein said housing comprises an upper housing, a lower housing, and a center chassis for dividing these housings; and
said one of surfaces is any one of the surfaces that constitute said upper housing.

17. Electronic equipment comprising equipment elements and a housing for accommodating said equipment elements, wherein among said equipment elements are included at least one element for executing at least input or output of information between said equipment element and an external apparatus, said housing has a configuration comprising a plurality of surfaces, at least one of said surfaces comprises a pattern of projections and depressions comprising an arrangement of a plurality of projecting ridges each extending in the same direction and a plurality of depressed grooves generated between the respective adjacent ridges, and at least one opening that opens in the middle of said pattern of projections and depressions, two sides of which are aligned in the same direction as said projecting ridges;

wherein said equipment elements includes as said at least one element at least one of:
 a recording medium drive unit having a mounting portion for mounting a recording medium and reading information from said recording medium mounted in said mounting portion;
 a first socket connector for receiving mounting of a recording device for recording and reproducing data, and detachably retaining and electrically connecting said recording device; and
 a second socket connector for receiving a plug connector, and detachably retaining and electrically connecting said plug connector;

wherein there are provided a plurality of said openings;
 at least one of said plurality of openings is a first opening wherein said mounting portion is retractable;
 at least one of said plurality of openings is a second opening wherein said first socket connector can be mounted therein; and
 at least one of said plurality of openings is a third opening wherein said second socket connector can be mounted therein; and wherein each of said first to third openings is such that one of said two sides of said openings is located in any one of said plurality of depressed grooves and the other side thereof is located in another of said depressed grooves.

18. Electronic equipment according to claim 17, wherein said housing includes a shutter at said second opening to which said first socket connector is mounted, for closing said second opening; and
said shutter is provided with said second projecting ridge on the outer surface thereof.

19. Electronic equipment according to claim 18, wherein said second projecting ridge extends in the same direction as the projecting ridges constituting said pattern of projections and depressions.

20. Electronic equipment according to claim 17, wherein said mounting portion comprises a third projecting ridge on the surface of said mounting portion stored within said first opening, that covers said first opening.

21. Electronic equipment according to claim 20, wherein said third projecting ridge extends in the same direction as the projecting ridges that constitute said pattern of projections and depressions.

22. Electronic equipment according to claim 21, wherein said recording medium drive unit at least reads information from a disk-type recording medium mounted in the mounting portion.

23. Electronic equipment according to claim 17, wherein said equipment elements further comprise an operation unit having a key top; and
in that a fourth opening for disposing said key top is provided on said first surface.

* * * * *